United States Patent
Matsumoto et al.

(10) Patent No.: US 7,619,856 B2
(45) Date of Patent: Nov. 17, 2009

(54) HEAD GIMBAL ASSEMBLY PROVIDED WITH SOLDER BALL CONNECTING STRUCTURE ALLOWING RE-UTILIZATION OF SUSPENSION

(75) Inventors: Yuhsuke Matsumoto, Kanagawa (JP); Tatsushi Yoshida, Kanagawa (JP); Noriyuki Saiki, Kanagawa (JP); Yukihiro Isono, Kanagawa (JP); Hideo Yamakura, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 407 days.

(21) Appl. No.: 11/317,343

(22) Filed: Dec. 22, 2005

(65) Prior Publication Data
US 2006/0139809 A1 Jun. 29, 2006

(30) Foreign Application Priority Data
Dec. 27, 2004 (JP) ............................. 2004-376310

(51) Int. Cl.
G11B 5/60 (2006.01)
(52) U.S. Cl. ............... 360/234.5; 360/234.6; 29/603.06
(58) Field of Classification Search ............. 360/234.5, 360/234.6; 29/603.06
See application file for complete search history.

(56) References Cited

U.S. PATENT DOCUMENTS

| 6,262,858 | B1 | 7/2001 | Sugiyama et al. | |
| 6,608,728 | B1 | 8/2003 | Sugiyama | |
| 6,871,392 | B2 * | 3/2005 | Tsuchiya et al. | 29/603.03 |
| 6,879,465 | B2 * | 4/2005 | Tsuchiya et al. | 360/245.4 |
| 6,985,335 | B2 * | 1/2006 | Tsuchiya et al. | 360/245.4 |
| 6,989,969 | B2 * | 1/2006 | Tsuchiya et al. | 360/245.4 |
| 7,137,188 | B2 * | 11/2006 | Tsuchiya et al. | 29/603.03 |
| 7,137,189 | B2 * | 11/2006 | Tsuchiya et al. | 29/603.06 |
| 7,168,154 | B2 * | 1/2007 | Tsuchiya et al. | 29/603.06 |
| 2005/0199680 | A1 * | 9/2005 | Matsumoto et al. | 228/101 |

FOREIGN PATENT DOCUMENTS

| JP | 2002-025025 | 1/2002 |
| JP | 2002-251705 | 9/2002 |
| JP | 2003-123217 | 4/2003 |

* cited by examiner

Primary Examiner—Jefferson Evans
(74) Attorney, Agent, or Firm—Townsend and Townsend and Crew LLP; John Henkhaus (57) ABSTRACT

Embodiments of the invention provide a head gimbal assembly (HGA) provided with a solder ball connecting structure suitable for the re-utilization of a suspension assembly. In one embodiment, the HGA includes lead wires provided at front ends thereof with lead pads and also includes slider pads capable of being connected to the lead pads by solder ball bonding with the use of solder balls. Respective grooves formed in the surfaces of the slider pads inhibit the solder balls from rotating and moving over the surfaces of the slider pads and the lead pads before the radiation of a laser beam.

12 Claims, 11 Drawing Sheets

HEAD GIMBAL ASSEMBLY PROVIDED WITH SOLDER BALL CONNECTING STRUCTURE ALLOWING RE-UTILIZATION OF SUSPENSION

CROSS-REFERENCES TO RELATED APPLICATIONS

This application claims priority from Japanese Patent Application No. JP2004-376310, filed Dec. 27, 2004, the entire disclosure of which is incorporated herein by reference.

BACKGROUND OF THE INVENTION

The present invention relates to a connecting structure for connecting slider pads and lead pads with each other through solder balls in a head gimbal assembly used in a magnetic disk drive. More specifically, the present invention relates to a solder ball connecting structure suitable for the re-utilization of a suspension assembly.

Recently, magnetic disk drives have come to be used in various electronic devices and the necessity of improving the yield in mass production has become more and more important than before. The magnetic disk drive incorporates a head gimbal assembly (hereinafter referred to as "HGA") which supports a slider formed with a magnetic head for reading and writing data. The HGA includes a head/slider having a magnetic head and a slider, a flexure which permits the head/slider to fly above a magnetic disk and perform a track following operation while performing a soft pivot motion, a load beam for applying a preload force to the flexure, a mounting plate for fixing the load beam to an actuator assembly, and a lead wire for connecting the magnetic head and a circuit board with each other. The construction of the HGA exclusive of the head/slider is designated a suspension assembly.

The head/slider is formed with a slider pad which plays the role of a relay terminal for connecting the magnetic head to a lead pad formed at an end of the lead. The head/slider is fixed to a flexure tongue of the flexure with an adhesive after formation of the suspension assembly. After fixing the head/slider to the flexure tongue, it is necessary to connect the lead pad and the slider pad electrically with each other.

The connection surfaces of the lead pad and the slider pad are placed in a positional relation such that planes including those connection surfaces intersect each other perpendicularly (a virtual right angle is formed at an intersecting point of both pads' connection surfaces when seen sideways). Examples of a technique for connecting both pads include a solder ball connecting method described in Patent Document 1 (Japanese Patent Laid-Open No. 2003-123217). According to the solder ball connecting method, first the HGA is supported in such a manner that a virtual right angle formed by both pads faces vertically upward, and the solder ball is disposed so as to contact both pads. Thereafter, a laser beam is applied to the solder ball to melt the solder, thereby connecting both pads.

Figure 11:
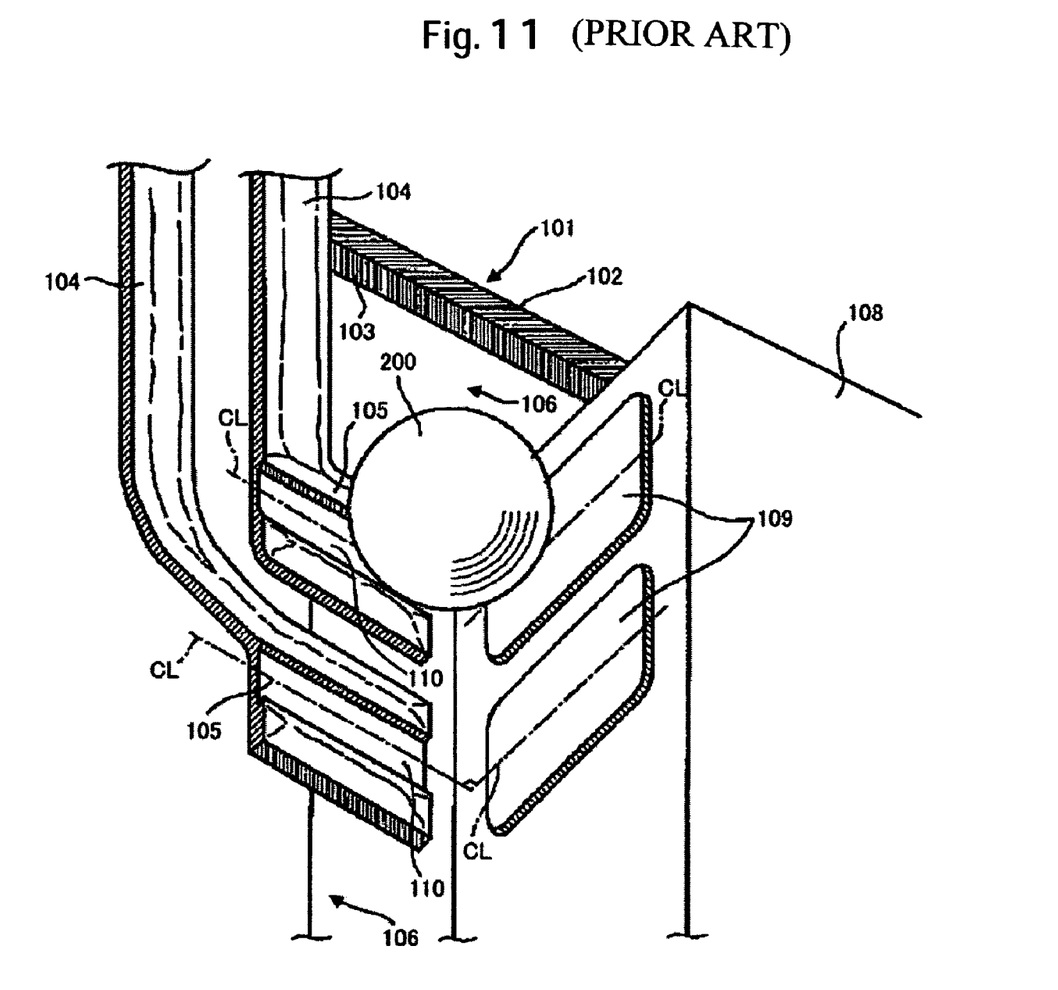
FIG. 11 is a diagram explaining a conventional solder ball bonding technique using a lead pad formed with a concave portion.

FIG. 11 shows a lead pad-slider pad connecting structure described in FIG. 6 of Patent Document 1. A flexure 101 in a suspension assembly is of a two-layer structure comprising a polyimide layer 102 which is an insulating polymer material and a stainless steel foil layer 103. Lead wires 104 are formed by a conductor layer on the polyimide layer 102 and lead pads 105, which are wider than the lead wires 104 so as to have an area sufficient for solder ball connection, are formed at ends of the lead wires 104.

The polyimide layer 102 and the stainless steel foil layer 103 can be processed into predetermined shapes by covering required portions with resist and subsequent etching. In the case where the polyimide layer 102 is a photosensitive polyimide layer, the photosensitive polyimide layer 102 can be processed into a predetermined shape by covering required portions of the photosensitive polyimide layer with resist and subsequent exposure and development. An aperture 106 is formed in a front end portion of each lead pad 105 in the flexure 101 in order to avoid adhering of protruded adhesion to the lead pad 105 at the time of bonding a head/slider 108 to the flexure 101 or in order to avoid a change of the polyimide layer 102 as a polymer material due to the generation of heat under the application of a laser beam.

Therefore, the front end portion of each lead pad 105 is formed as an aerial wiring projecting into the aperture 106. In each lead pad 105 is formed a concave portion 110 in a symmetric shape with respect to a center line CL of the surface of the lead pad. Slider pads 109 of the head/slider 108 are arranged at positions perpendicularly intersecting the lead pads 105 as noted earlier. Therefore, virtual orthogonal axes defined by a plane extending from a connection surface of each slider pad 109 and a plane extending from a connection surface of the corresponding lead pad 105 intersect each other are at an angle of 90° (right angle). In case of connecting each slide pad 109 and the corresponding lead pad 105 with each other by use of a spherical solder ball 200, the HGA is fixed in a direction in which a virtual right angle defined by each slider pad 109 and the corresponding lead pad 105 for temporarily fixing the solder ball 200 faces vertically upward and is open.

Usually, the HGA is fixed in such a manner that each lead pad 105 on the flexure 101 and the corresponding slider pad 109 on the head/slider 109 are each at a rising angle of 45° from a horizontal plane while maintaining the mutual orthogonal positional relation. When the solder ball 200 is dropped by gravity into the concave portion 110 of each lead pad 105 from a solder ball transfer device (not shown), the solder ball is held by both pads at the position of the center line CL. Thereafter, the solder ball 200 is heat-melted by means of a laser beam irradiator (not shown) to connect both pads. For improving the quality of the solder ball connection it is necessary to position the solder ball 200 on the center lines CL of both pads and thereafter apply a laser beam to the solder ball to melt the solder. In this case, the concave portion 110 can prevent the solder ball 200 from rolling on the surface of the lead pad 105 and deviating from the center line CL.

After connecting the lead pads and the slider pads with each other through solder balls and before incorporation into a magnetic disk drive, the HGA is subjected as a single member to a function test under the application of an electric signal. The magnetic head is a particularly delicate component among the components of the magnetic disk drive and may be at fault from the beginning or may become inoperative during assembly of the HGA due to the discharge of static electricity or an external shock. As a result, the HGA does not pass the function test in some cases. Most of the causes of failure of the HGA in the function test are attributable to the magnetic head. Therefore, if the head/slider alone can be removed from the HGA and replaced with another one, permitting re-utilization of the suspension assembly, then the improvement in yield of the HGA and the reduction of manufacturing cost will conveniently be achieved.

In the solder ball connecting structure of FIG. 11 described in Patent Document 1, however, when the solder which has been solidified to connect the lead pads and the slider pads with each other is removed and the head/slider 108 is dismounted from the suspension assembly, the solder remains within the concave portion 110 of each lead pad. Since the lead pads are fragile in structure, it is difficult to remove the solder from each concave portion 110 so as to permit re-utilization of the suspension assembly. In particular, since a high melting lead-free solder has often been used recently, it is becoming more and more difficult to remove the solder remaining in the concave portion 110. This is because the lead wires and polyimide layer may be damaged if still higher thermal energy is applied to the lead pads for melting the lead-free solder.

In the suspension assembly with solder remaining with each concave portion 110, the solder ball 200 cannot temporarily be fixed at the position of the center line CL at the time of replacing the head/slider and making re-connection through solder balls, so that it is impossible to effect solder connection of good quality.

BRIEF SUMMARY OF THE INVENTION

Accordingly, it is a feature of the present invention to provide an HGA adopting a lead pad-slider pad connecting structure which can locate a solder ball accurately at a predetermined position in a magnetic disk drive. It is another feature of the present invention to provide an HGA adopting a lead pad-slider pad connecting structure which is suitable for the re-utilization of a suspension assembly. It is a further feature of the present invention to provide a magnetic disk drive adopting any of such HGAs.

The principle of the present invention resides in a lead pad-slider pad connecting structure using a solder ball wherein a restraining portion is provided in the slider pad to permit re-utilization of a suspension assembly. In one aspect of the present invention there is provided a head gimbal assembly comprising a lead wire having a lead pad; a head/slider having a slider pad capable of being soldered to the lead pad with use of a solder ball, a restraining portion being provided in the slider pad, the restraining portion restraining rotation and movement of the solder ball while being supported by a surface of the slider pad and a surface of the lead pad; a flexure for fixing the head/slider; and a load beam for fixing the flexure.

The restraining portion may be constituted by side walls which are abutted at two points against a solder ball. The restraining portion may be constituted by a groove formed in the surface of the slider pad. The width of the groove may be not larger than the diameter of the solder ball and not smaller than two thirds of the diameter of the solder ball. If the groove is formed wider at its position close to an air bearing surface of the head/slider than at its position close to a fixing surface of the head/slider, it is possible to have a margin in the solder ball dropping accuracy.

The restraining portion may be constituted by a projecting portion formed on the surface of the slider pad. The restraining portion may be formed by an aperture formed by half-etching the slider pad. The larger the number of slider pads, the narrower the spacing between adjacent slider pads, so that short-circuit is apt to occur at the time of performing the solder ball connection. However, by adopting such a connecting structure superior in the solder ball positioning accuracy as in the present invention, it is possible to prevent the occurrence of short-circuit and effect solder ball connection of high quality.

According to the present invention it is possible to provide an HGA adopting a lead pad-slider pad connecting structure capable of locating a solder ball accurately at a predetermined position in a magnetic disk drive. Moreover, it is possible to provide an HGA adopting a lead pad-slider pad connecting structure suitable for the re-utilization of a suspension assembly. Further, it is possible to provide a magnetic disk drive adopting any of such HGAs.

DETAILED DESCRIPTION OF THE INVENTION

Figure 1:
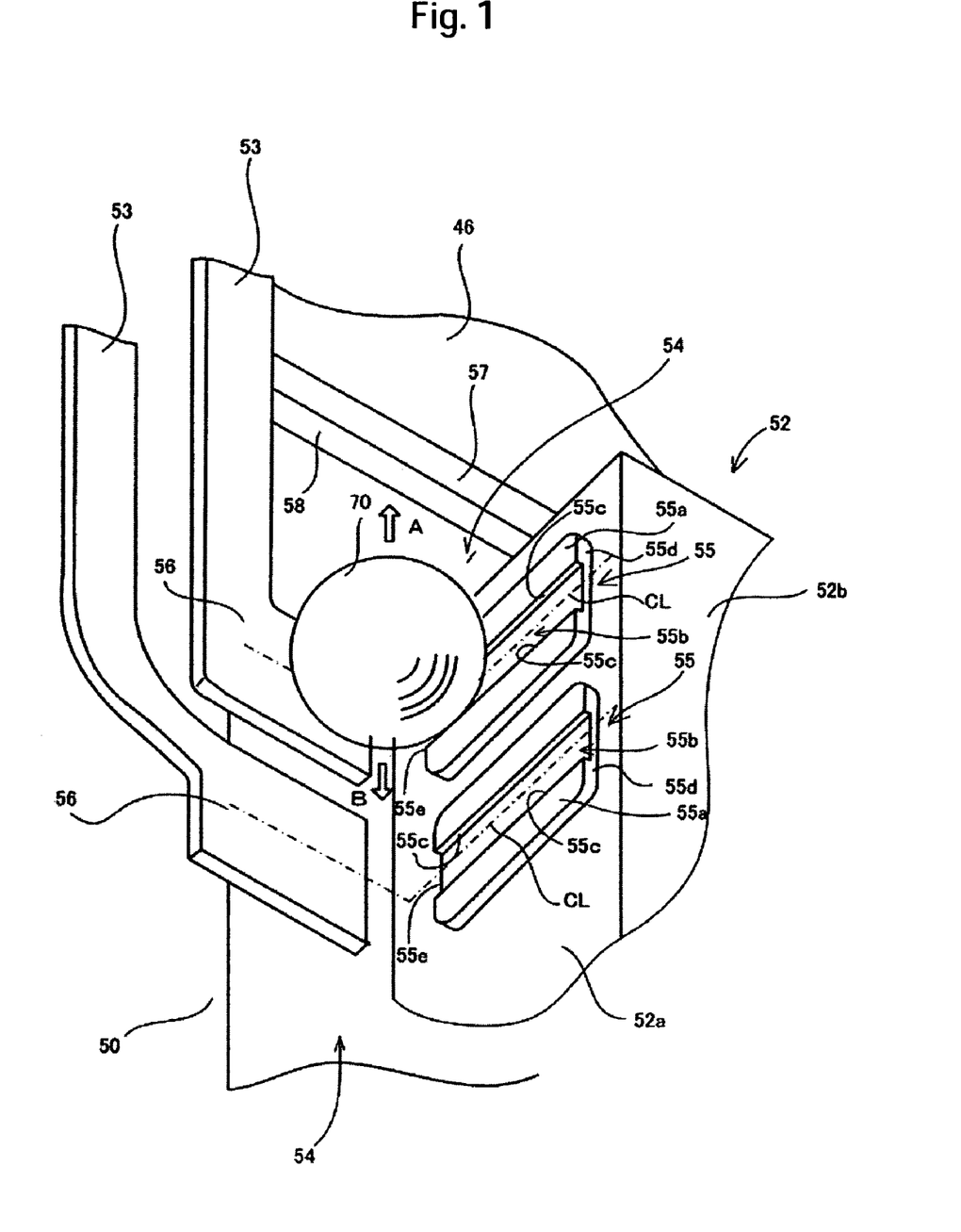
FIG. 1 is a perspective view showing a head suspension assembly according to an embodiment of the present invention.
Figure 2:
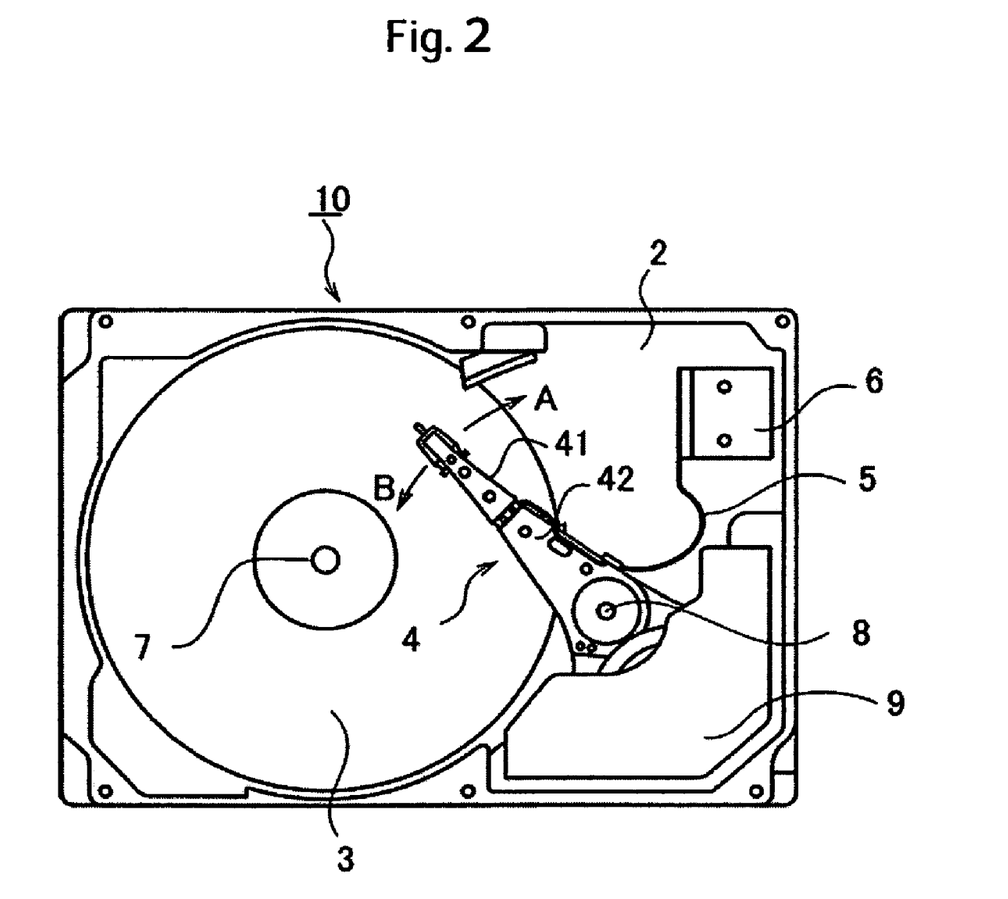
FIG. 2 is a plan view showing the construction of a magnetic disk drive.
Figure 3:
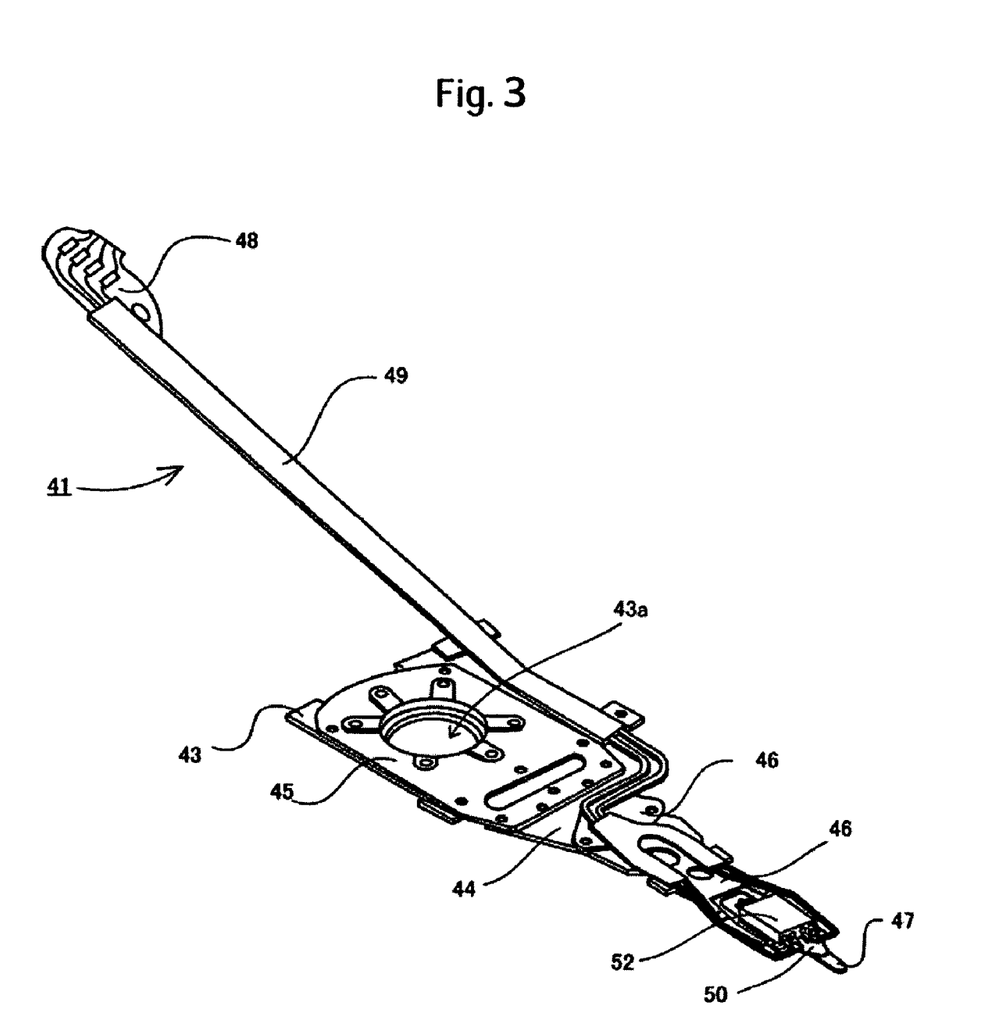
FIG. 3 is a perspective view showing an entire construction of a head gimbal assembly.
Figure 4:
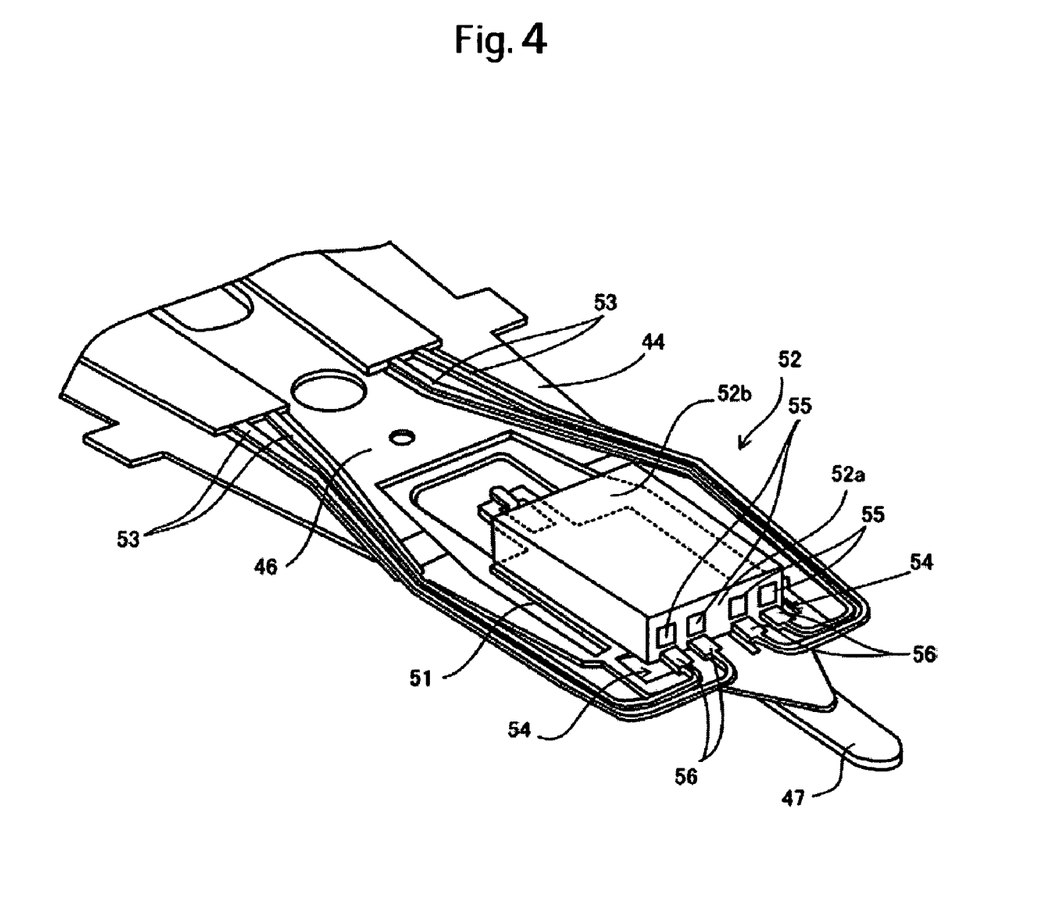
FIG. 4 is a partially enlarged perspective view of a head/slider portion in the head gimbal assembly of FIG. 3.

A magnetic disk drive and an HGA according to an embodiment of the present invention will be described hereafter with reference to the drawings. FIG. 1 is a perspective view showing a lead pad-slider pad connecting structure in an HGA embodying the present invention, FIG. 2 is a plan view showing the construction of a magnetic disk drive embodying the present invention, FIG. 3 is a perspective view showing the entire construction of the HGA, and FIG. 4 is a partial enlarged view of a head/slider portion of the HGA shown in FIG. 3. In all of the drawings related to the present invention, the same constituent elements are identified by the same reference numerals.

In a magnetic disk drive 10, as shown in FIG. 2, a magnetic disk 3, a head stack assembly 4, a flexible cable 5, and a terminal 6 for connecting the flexible cable 5 to an external circuit board, are provided on a base 2. The magnetic disk 3 is screwed to a rotor portion of a spindle motor (not shown) which is provided in the base 2 and is constructed so as to rotate about a spindle shaft 7.

The head stack assembly 4 is made up of an HGA 41 and an actuator assembly 42. For example as shown in FIG. 3, the HGA 41 is constructed as a wiring integrated type suspension assembly and a principal portion thereof is included of a head/slider 52, a base plate 43, a load beam 44, a hinge 45, and a flexure 46. An aperture 43*a* is formed in the base plate 43. The HGA is fixed to the actuator assembly 42 by swaging a mounting plate through the aperture 43*a*, the mounting plate being fixed to the back side of the base plate 43. The structure of the HGA 41 exclusive of the head/slider is designated a suspension assembly.

For wiring integrated type suspension assemblies, a subtractive type or an FPC type manufacturing method is used depending on differences in their manufacturing methods in addition to an additive type which is related to this embodiment, but the present invention is applicable to any type of suspension assembly. The additive type indicates a type in which copper foil wiring and pads are formed additively on an insulator of a suspension. The subtractive type indicates a type in which wiring and pads are formed by etching copper foil formed like a sheet on an insulator of a suspension. The FPC type indicates a type in which a flexible printed circuit board (FPC) formed with copper foil wiring and pads is bonded to a suspension.

The hinge 45, which has elasticity, connects the base plate 43 and the load beam 44 with each other and imparts a preload force to the load beam 44 so that the head/slider can fly properly over the magnetic disk. A lift tab 47 for implementing a load/unload system together with a ramp is formed at a front end portion of the HGA 41. The flexure 46 holds on its front end side a lead wire 49 which extends in a crank shape from the front end portion of the HGA 41 up to a connector portion 48. The flexure 46 is spot-welded to the load beam 44 and base plate 43 by means of a laser. The lead wire 49 includes four conductors for connection between a magnetic head formed on the head/slider 52 and the flexible cable 5. The number of conductors varies depending on the construction of the magnetic head.

The flexure 46 is fixed to the load beam 44 so that a flexure tongue 51 with the head/slider 52 fixed thereto can perform pivot motions or gimbal motions. As shown in FIG. 4, a flexure tongue 51 is formed so as to project toward the center of an aperture from a platform 50 formed at the foremost end of the flexure 46, and a fixing surface of the head/slider 52 is fixed to the flexure tongue 51 with an adhesive in such a manner that air bearing surface 52b faces upward. As an adhesive having an appropriate adhesive force is selected, so that when it becomes necessary to replace the head/slider 52 as a result of a function test conducted under the application of a signal from a terminal in the connector portion 48, the head/slider 52 can be removed from the flexure tongue 51 in the adhesive portion.

With a dimple (not shown) projecting from the load beam 44, the flexure tongue 51 is supported at its position corresponding to the central part of the fixing surface of the slider 52. According to this structure, the head/slider 52, when flying over the magnetic disk under the action of an air flow created on the disk surface, can perform a track following operation while conducting soft pivot motions in both pitch and roll directions relative to the load beam 44.

An aperture 54 is formed between the platform 50 and the flexure tongue 51 where slider pads 55 and lead pads 56 are soldered together. As shown in FIG. 4, the lead wire 49 shown in FIG. 3 is divided from a position leaving a protective sheet or thereabouts into two pairs of lead wires 53. The lead wires 53 extend toward the front end portion of the HGA 41, then are bent sideways of the aperture 54 at an approximately right angle in a state in which they float in the air, and reach the platform 50. Further, on the platform 50, the lead wires 53 are again bent substantially perpendicularly toward the four slider pads 55 formed on a side face 52a on a trailing edge side of the head/slider 52.

The four slider pads 55 are connected to a write head and a read head both formed in the interior of the head/slider 52. The number of the slider pads 55 is not limited to four. Recently a head/slider of the type has also been developed where a thermal protrusion generated in the write head is heated with a heater to adjust the flying height. In this case, the head/slider has a total of six pads which are the pads connected to the write and read heads and additional pads connected to the heater. In this head/slider, the spacing between adjacent slider pads becomes narrower and hence a high accuracy is required for soldering between the lead pads and the slider pads. Thus, the connecting structure according to this embodiment is suitable because it is superior in the solder ball positioning accuracy.

The lead pads 56 are formed correspondingly at ends of the bent lead wires 53, the lead pads 56 being connected respectively to the slider pads 55 formed on the side face 52a on the trailing edge side of the head/slider 52. A point of intersection between a plane extending from the surface or connection surface of each slider pad 55 and a plane extending from the surface or connection surface of each lead pad 56 is formed at a right angle. In the present invention, however, it is not always necessary to limit the planes extending from the surfaces of each slider pad 55 and the corresponding lead pad 56 to a right angle. The intersecting angle may be any other angle selected as an angle suitable for the solder ball bonding.

The actuator assembly 42 is made up of an actuator arm which supports the HGA 41, a fixing portion for a pivot assembly which constitutes a pivot shaft 8, and a coil support which supports a voice coil. The actuator assembly 42 causes the HGA 41 to move pivotally in the direction of arrow A or B around the pivot shaft 8. The voice coil and a yoke 9, together with a voice coil magnet affixed to the back side of the yoke 9, constitute a voice coil motor ("VCM" hereinafter).

A description will now be given about a method for connecting the slider pads 55 and the lead pads 56 with each other by solder ball bonding. First, the HGA 41 is supported with a jig so that the right-angled portion formed at the point of intersection between the planes extending from the surfaces of each slider pad 55 and the corresponding lead pad 56 faces vertically upward. Then, a solder ball is placed temporarily between both pads and thereafter a laser beam is applied to the solder ball to connect both pads.

Figure 5:
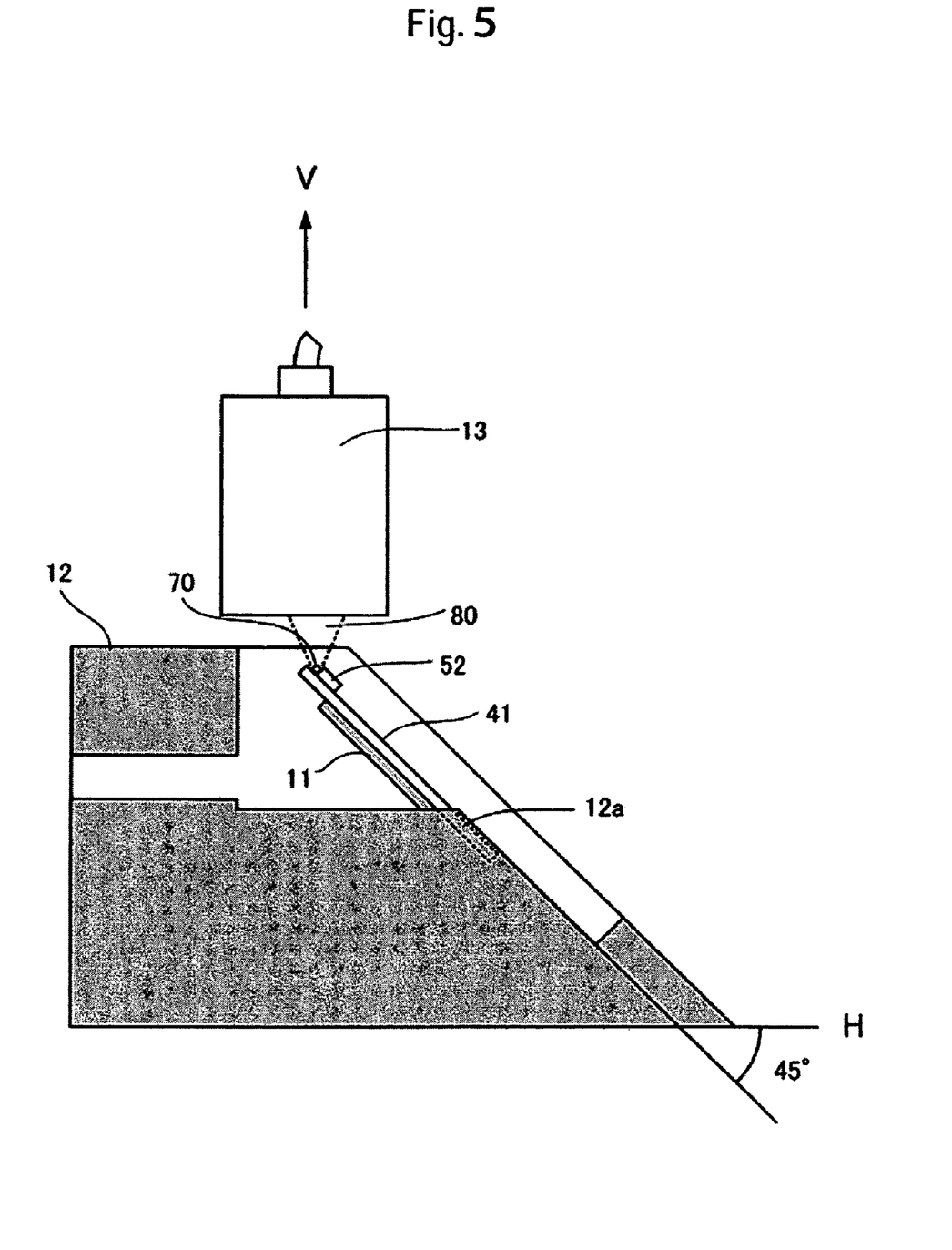
FIG. 5 is a diagram showing a solder ball bonder wherein a solder ball disposed between both pads is melted by applying a laser beam thereto to connect both pads.
Figure 6:
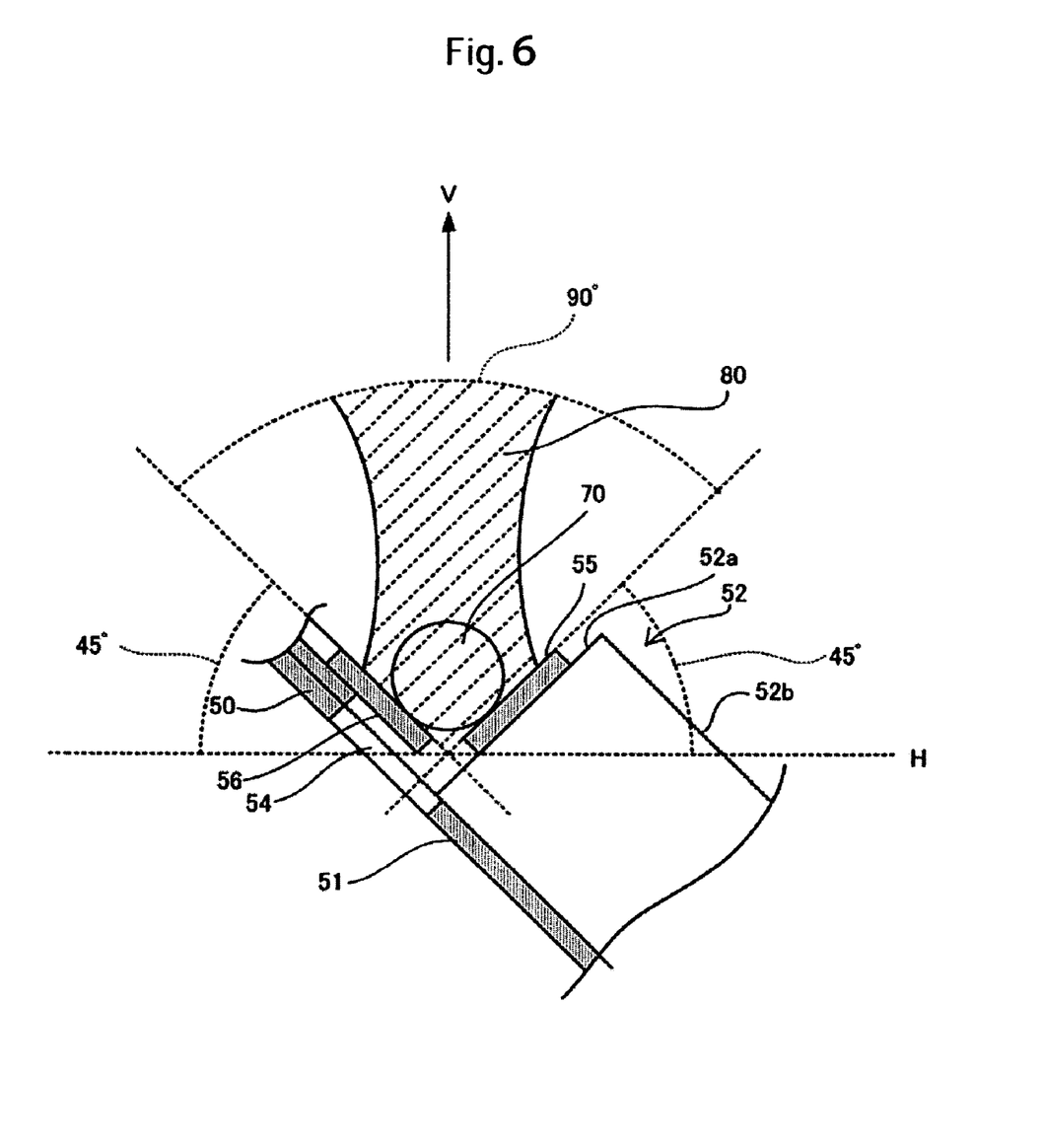
FIG. 6 is an enlarged diagram showing a state in which a solder ball is placed on the head gimbal assembly which is held by a working jig shown in FIG. 5.

The following description is now provided about a method for supporting the HGA 41 in such a manner that the right-angled portion formed by the surfaces of each slider pad 55 and the corresponding lead pad 56 faces upward. FIG. 5 is a sectional view of a solder ball bonder for connecting both pads by applying a laser beam to a solder ball 70 disposed between both pads, and FIG. 6 is a sectional view showing on a larger scale a state in which the solder ball 70 is placed temporarily on the HGA 41 held by a working jig 11 shown in FIG. 5. FIG. 5 shows an optical (laser) device 13 for applying a laser beam 80 to the solder ball 70, the working jig 11 for holding the HGA 41, and a table 12 for holding the working jig 11.

The table 12 has a rest surface 12a having a gradient of 45° relative to a horizontal plane H, and the working jig 11 is installed on the rest surface 12a so as to also have a gradient of 45° relative to the horizontal plane. The HGA 41 is held by the working jig 11 in such a manner that the air bearing surface 52b of the head/slider 52 faces upward (towards the optical device 13).

At this time, the surface of each slider pad 55 at the front end portion of the HGA 41 held by the working jig 11 and the surface of the lead pad 56 opposed thereto maintain an angle of approximately 45° relative to the horizontal plane. Thus, the HGA 41 is supported by the working jig 11 in such a manner that the virtual right-angled portion formed by the surface of each slider pad 55 and that of the corresponding lead pad 56 faces vertically upward, i.e., in the direction of arrow V.

Next, the solder ball 70 is placed temporarily between both pads and thereafter the laser beam 80 is applied to the solder ball 70. Regarding how to dispose the solder ball 70 between both pads and radiate the laser beam 80, it is disclosed in detail in Japanese Patent Laid-Open Nos. 2002-25025 and 2002-251705. The method for disposing the solder ball 70 and the construction of the optical device 10 will be described only briefly because they are not directly related to the present invention.

The optical device 13 is a terminal module of a fiber laser which utilizes an optical fiber in a resonator. The optical device 13 has a series of optical lenses arranged on an internal optical path to form a hollow space of a laser beam path. The optical lenses converge divergent light rays outputted from an optical fiber into the laser beam 80 and output the laser beam 80 from a front end portion of the optical device 13.

Each slider pad 55 and the corresponding lead pad 56 are each disposed so as to rise at an angle of 45° from the horizontal plane, and a plane extending from the surface of the slider pad 55 and a plane extending from the surface of the lead pad 56 intersect each other perpendicularly, whereby a virtual right-angled portion is formed between the two pads. Since the virtual right-angled portion is open vertically upward, it can catch the solder ball 70 when dropped and fed from a solder ball transfer device.

When the solder ball 70 is placed so as to contact the connection surfaces of each slider pad 55 and the corresponding lead pad 56 and becomes standstill, the optical device 13 is moved to an irradiating position by a moving mechanism (not shown) and radiates a converged laser beam 80 of a predetermined spot diameter to the solder ball 70. At a timing corresponding to the period after the temporary placing of the solder ball 70 until radiation of the laser beam 80, a predetermined amount of nitrogen gas $N_2$ for creating an inert atmosphere to suppress the oxidation of solder is injected from a nitrogen gas inlet pipe installed in the table 12, so that the slider pad 55, lead pad 56 and solder ball 70 are placed within the inert atmosphere. When nitrogen gas is injected, both injecting position and flow velocity are taken into account to prevent the solder ball 70 at a standstill from being shifted by wind pressure developed during the injection. However, when the surface condition of the slider pad 55 or the lead pad 56 is poor or when the attitude of the HGA 41 held by the table 12 is not proper, the solder ball 70 may shift in the direction of arrow A or B in FIG. 1 when nitrogen gas is injected.

While this inert atmosphere is maintained, the optical device 13 applies the laser beam 80 to the solder ball 70 to heat and melt the solder ball, thereby connecting the slider pad 55 and the lead pad 56 with each other. At this time, the spot diameter of the laser beam 80 is set for example at about 150 to 200 μm when the outside diameter of the solder ball 70 is about 120 μm. The solder ball 70 may have any of 80 μm, 110 μm, and 130 μm as its outside diameter.

Figure 7:
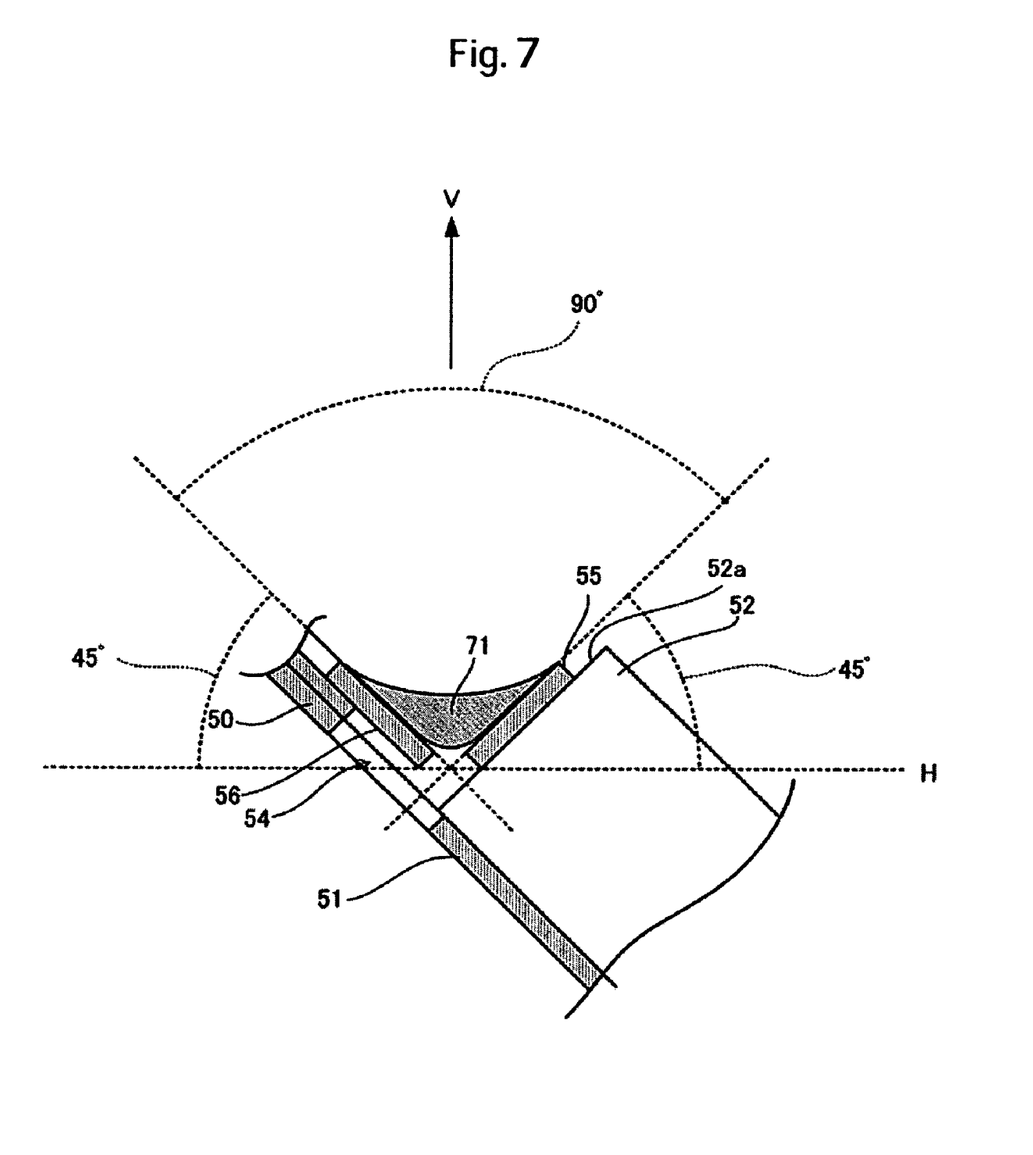
FIG. 7 is an enlarged diagram showing a state in which the solder ball shown in FIG. 6 is melted to form a solder fillet and a slider pad and a lead pad are thereby connected to each other.

Thus, by melting the solder under the inert atmosphere of nitrogen gas $N_2$, both pads are bonded together, then the solder is cooled to form a solder fillet, when the inert nitrogen gas $N_2$ covers the surface of the solder, whereby it is possible to prevent oxidation of the solder. FIG. 7 is a sectional view showing on a larger scale a state in which the solder ball 70 shown in FIG. 6 is melted and both slider pad 55 and lead pad 56 are connected together.

Melted solder ball 70 spreads throughout the entire surfaces of the slider pad 55 and the lead pad 56, and then is cooled and solidified upon subsequent stop of radiation of the laser beam. As a result, a solder fillet 71 is formed, connecting both pads in an inverted arch shape as shown in FIG. 7. Unless the solder ball 70 is disposed near the center of each pad before radiation of the laser beam, melted solder may not spread throughout the entire surface of each pad or a short-circuit may occur between adjacent solder fillets or between adjacent pads, thus making it impossible to form a solder fillet of good quality.

In this embodiment, as shown in FIG. 1, a vertical groove 55b is formed in the surface of each slider pad 55. The groove 55b is formed in each slider pad 55 so as to extend from an end 55d on the air bearing surface 52b side up to an end 55e on the fixing surface side attached to the flexure. The slider pads 55 are formed by gold plating on a seed layer such as nickel or chromium which is formed on the surface of the slider 52.

The head/slider 52, including the magnetic head and the slider pads, is fabricated in a semiconductor process. The groove 55b can be formed by pressing a surface 55a of each slider pad 55. The groove 55b has a pair of side walls 55c which inhibit the solder ball 70 from moving in the direction of arrow A or B ("slider transverse direction" hereinafter). The side walls 55c are formed at symmetric right and left positions with respect to the center line CL of the slider pad 55. When the solder ball transfer device supplies the solder ball 70 to the groove 55b by gravitational dropping, the pair of side walls 55c align the position in the slider transverse direction of the solder ball 70 and fix the solder ball temporarily to the center of the slider pad 55.

The side walls 55c function as a restraining portion which contacts the solder ball 70 at two points to inhibit the rotation and movement of the solder ball. Therefore, even if any acceleration in the slider transverse direction is applied to the solder ball 70 by subsequent introduction of nitrogen gas or by oscillation of the optical device, the side walls 55c inhibit movement of the solder ball 70 and permit the solder ball 70 to be held stably at the center of the slider pad.

Since the center of each slider pad 55 and that of the corresponding lead pad 56 are disposed so as to be in positional alignment with each other, a solder fillet of good quality can be formed between both pads by the application of a laser beam. Such a different point between the HGA 41 and the conventional HGA resides in only the structure of the surface or connection surface of each slider pad 55. It should be noted that any construction of a conventional HGA which permits solder ball bonding may be adopted for the other construction.

Figure 8:
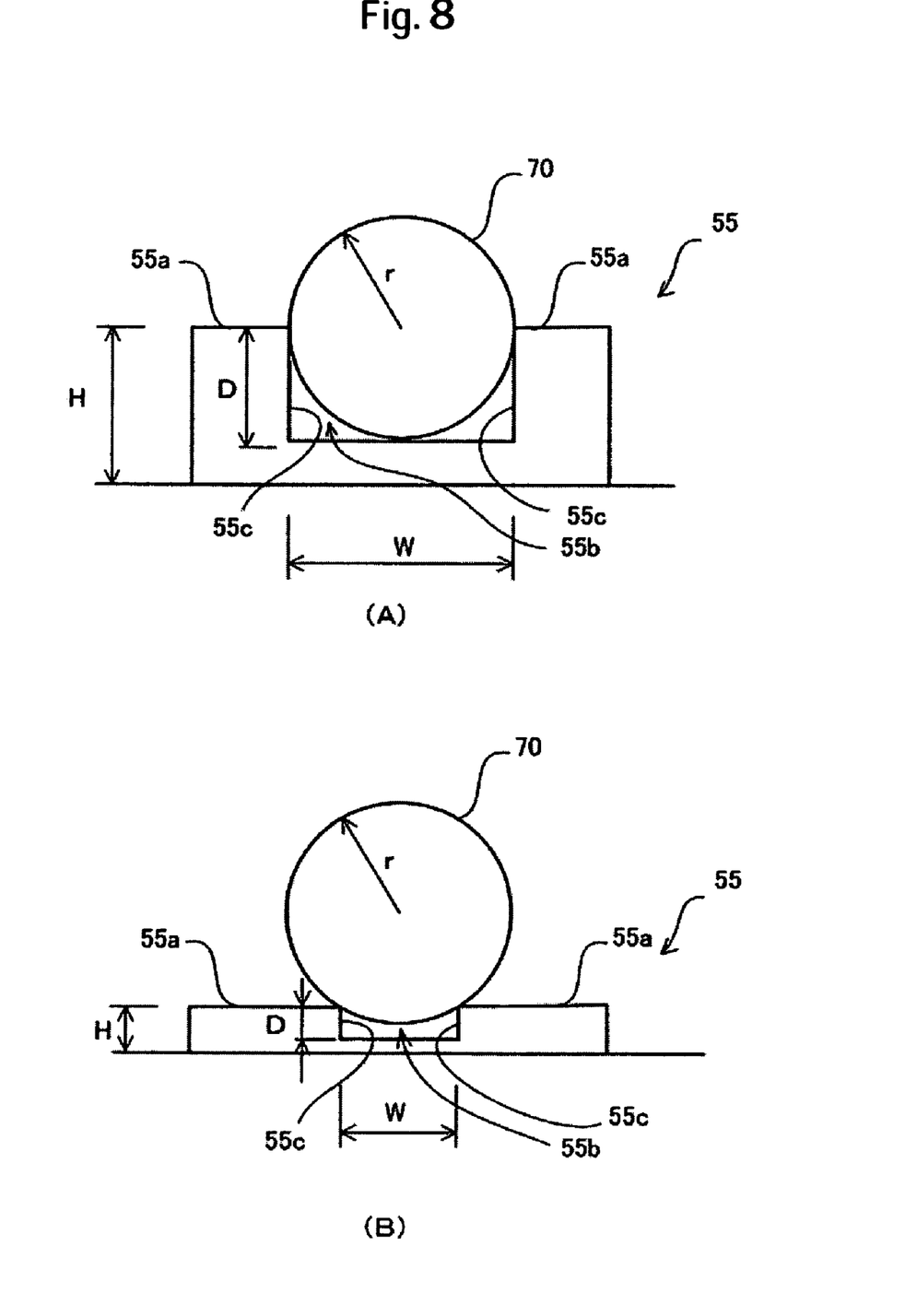
FIG. 8 is a diagram explaining a shape of a slider pad.

FIG. 8 is a side view showing a state in which the solder ball 70 is held in a slider pad 55 as seen from the air bearing surface side. In FIG. 8(A), the width W of the groove 55b which depends on the spacing between the side walls 55c is equal to the diameter 2r of the solder ball. If the width of the groove 55b is made larger, the solder ball 70 will move in the slider transverse direction within the groove. Therefore, W=2r is the maximum value of the width W of the groove 55b. In this case, the depth D of the groove 55b becomes larger correspondingly to the width W and therefore it is necessary that the height H of the slider pad 55 be also made larger to such an extent as permits formation of the groove with depth D.

When W=2r, the solder ball 70 held in the groove 55b is most stable, but since the height H becomes larger, the amount of gold plating for forming the slider pad 55 also becomes larger. Moreover, the diameter of the solder ball 70 and the width W of the groove 55b have tolerances and therefore a difficulty is encountered in making W equal to 2r exactly. Actually, the width W of the groove 55b is determined so as to satisfy the relation of W<2r. In this case, the smaller the width W of the groove 55b, the more deteriorated the ability of the groove to hold the solder ball 70 centrally of the slider pad 55 or between the side walls 55c. However, as shown in FIG. 8(B), since the depth D of the groove becomes smaller with a decrease of the width W, it is possible to make the height H of the slider pad 55 low and thereby decrease the amount of gold plating.

It is necessary that a minimum value of the width W of the groove 55b be determined taking the ease of rolling of the solder ball 70 and the height of the slider pad 55 into account, but it is preferable to satisfy the relation of W>(2r/3). However, it is obvious that even if the width W is smaller than 2r/3, the solder ball holding ability is enhanced in comparison with a slider pad having a connection surface the whole of which is flat. It is preferable that a spacing be provided between the bottom of the groove 55b and the solder ball 70. This is because the width W of the groove 55b and the diameter of the solder ball 70 have tolerances and therefore it becomes impossible for the side walls 55c to hold the solder ball 70 if the bottom of the groove 55b and the solder ball contact each other.

According to the lead pad-slider pad connecting structure described above, the connection surface of each lead pad 56 is formed as a flat surface, while the corresponding slider pad 55 is formed with groove 55b, so that the solder ball 70 can be temporarily fixed centrally of the slider pad 55 and the lead pad 56 and it is possible to form a solder fillet of good quality for connection between both pads. According to the results of the function test, in case of replacing the head/slider and re-utilizing the suspension assembly, it is not necessary to remove solder which has entered the groove 55b of each slider pad, and as to solder adhered to each lead pad 56, since the connection surface of the lead pad is flat, the solder can be removed easily for example by a method involving melting the solder by the application of head and blowing off the melted solder with an inert gas. Further, according to the results of the function test, also in the case of a defective solder fillet, the suspension assembly can be re-utilized by removing and replacing the head/slider 52 and again performing the solder ball bonding.

The groove 55b formed in the surface of the slider pad 55 functions to let the solder ball 70 dropped from the transfer device be caught surely by each slider pad 55 and the corresponding lead pad 56, dispose the solder ball centrally of the slider pad and fix it temporarily until melted by laser beam radiation to form a solder fillet. The slider pad for implementing such a function may have any of various other surface structures.

Figure 9:
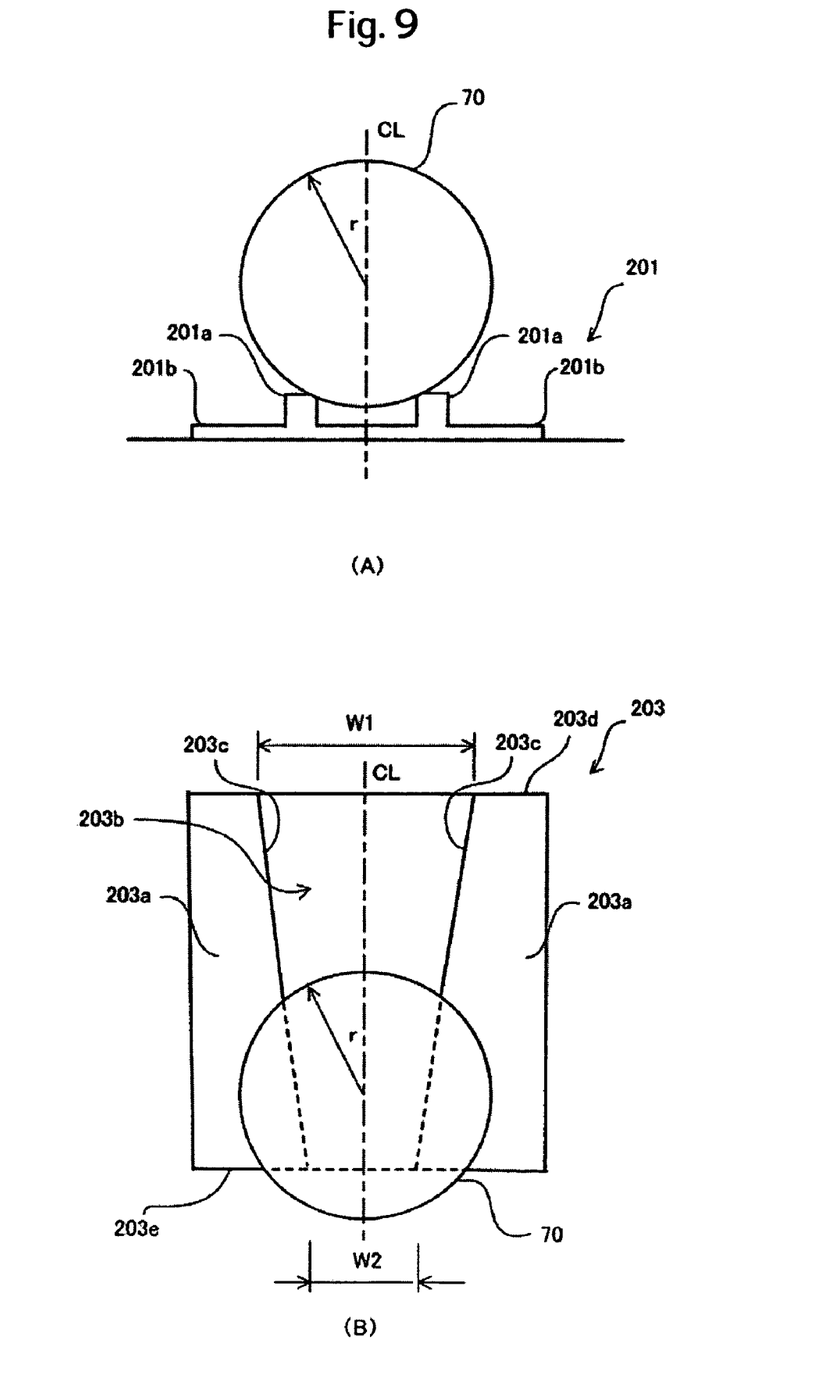
FIG. 9 is a diagram explaining another shape of a slider pad.

FIG. 9(A) is a side view of a slider pad 201 and the solder ball 70 according to another embodiment of the present invention as seen in the same direction as in FIG. 8. The slider pad 201 is formed with a pair of projecting portions 201a as a restraining structure for inhibiting the solder ball 70 from rotating and moving in the transverse direction of the head/slider. The pair of projecting portions 201a project from connection surfaces 201b of the slider pad 201 and can sandwich and fix the solder ball 70 therebetween. The projecting portions 201a are formed from a side end portion of an air bearing surface of the slider pad 201 up to a side end portion of a fixing surface of the slider pad.

FIG. 9(B) is a front view of a slider pad 203 according to a further embodiment of the present invention. Like the slider pad 55 shown in FIG. 1, the slider pad 203 is formed with a concave portion 203b depressed from flat connection surfaces 203a. A pair of side walls 203c are formed between the connection surfaces 303a and the concave portion 203b symmetrically with respect to a center line CL. The side walls 203c are spaced from each other so as to satisfy the relation of W1>W2 where W1 stands for the width at an end 203d close to an air bearing surface of the slider pad 203 and W2 stands for the width at an end 203e close to a fixing surface of the slider pad.

The solder ball 70 is fed by gravitational dropping from the side close to the air bearing surface and therefore, if the spacing between the upper side wall portions is set wide, the solder ball can be held between the side walls 203c even if the solder ball dropping position from the solder ball transfer device is somewhat off-centered.

Figure 10:
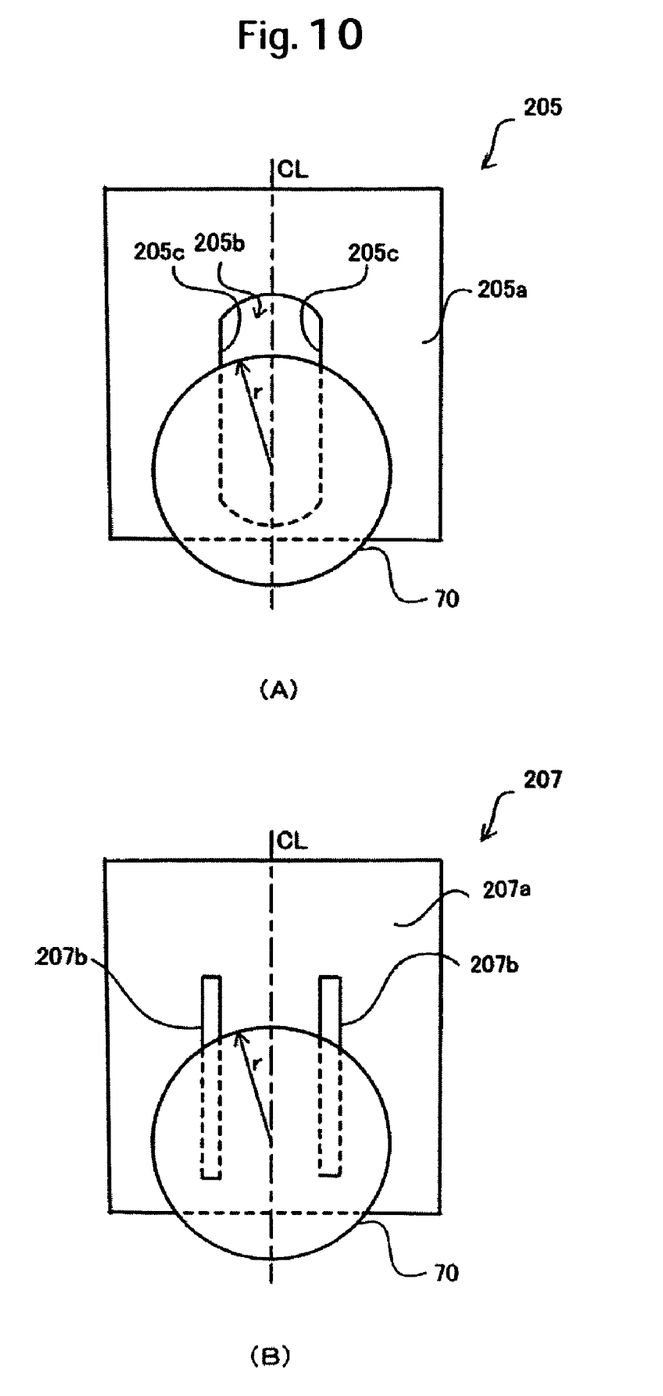
FIG. 10 is a diagram explaining a further shape of a slider pad.

FIG. 10(A) is a diagram showing a slider pad 205 according to a still further embodiment of the present invention and the solder ball 70 on the slider pad and as seen from the front side of the slider pad. As a restraining structure for the solder ball 70, the slider pad 205 has an aperture 205b formed by half-etching a gold plating layer from a surface 205a of the slider pad 205. A pair of side walls 205c of the aperture 205b inhibit movement of the solder ball 70 and position the solder ball centrally of the slider pad.

A slider pad 207 shown in FIG. 10(B) has a restraining structure as a modification of the restraining structure illustrated in FIG. 9(A). As a restraining structure for the solder ball 70, the slider pad 207 has a pair of projecting portions 207b formed partially on a surface 207a of the slider pad 207.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A head gimbal assembly comprising:
    a lead wire having a lead pad with a connection surface;
    a head/slider having a slider pad configured to be soldered to said connection surface of said lead pad with use of a solder ball, a restraining portion being provided in said slider pad, said restraining portion comprising a groove formed in the surface of said slider pad, wherein said groove is wider at a position thereof close to an air bearing surface of said head/slider than at a position thereof close to a fixing surface of said head/slider, said restraining portion restraining rotation and movement of said solder ball while being supported by a surface of said slider pad and said connection surface of said lead pad;
    a flexure configured to support said head/slider; and
    a load beam configured to support said flexure,
    wherein said connection surface is formed as a flat surface to allow removal of solder adhered thereto and reuse of the lead pad.

2. The head gimbal assembly according to claim 1, wherein the width of said groove is not larger than the diameter of said solder ball.

3. The head gimbal assembly according to claim 2, wherein the width of said groove is not smaller than two thirds of the diameter of the solder ball.

4. The head gimbal assembly according to claim 1, wherein said groove comprises an aperture formed by half-etching said slider pad.

5. The head gimbal assembly according to claim 1, wherein said slider pad is formed by gold plating.

6. The head gimbal assembly according to claim 1, wherein said flexure, said load beam and said lead wire constitute a wiring integrated type suspension assembly.

7. The head gimbal assembly according to claim 1, wherein a plane including a connection surface of said slider pad and a plane including a connection surface of said lead pad intersect each other at a right angle.

8. The head gimbal assembly according to claim 1, wherein six said slider pads are formed on said head/slider.

9. A magnetic disk drive comprising:

a magnetic disk;

a head gimbal assembly on which a head/slider is mounted, said head/slider being adapted to access said magnetic disk; and an actuator assembly configured to pivotally move said head gimbal assembly;

wherein said head gimbal assembly comprises:

a lead wire having a lead pad with a connection surface;

a head/slider having a slider pad configured to be soldered to said connection surface of said lead pad with use of a solder ball, a restraining portion being provided in said slider pad, said restraining portion comprising a groove formed in the surface of said slider pad wherein said groove is wider at a position thereof close to an air bearing surface of said head/slider than at a position thereof close to a fixing surface of said head/slider, said restraining portion restraining rotation and movement of said solder ball while being supported by a surface of said slider pad and said connection surface of said lead pad;

a flexure configured to support said head/slider; and a load beam configured to support said flexure, wherein said connection surface is formed as a flat surface to allow removal of solder adhered thereto and reuse of the lead pad.

10. The magnetic disk drive according to claim 9, wherein the width of said groove is not larger than the diameter of said solder ball.

11. The magnetic disk drive according to claim 10, wherein the width of said groove is not smaller than two thirds of the diameter of the solder ball.

12. The magnetic disk drive according to claim 9, wherein said groove comprises an aperture formed by half-etching said slider pad.

* * * * *